United States Patent [19]

Radichel

[11] 4,001,686
[45] Jan. 4, 1977

[54] ELECTRONIC CIRCUIT TESTING APPARATUS

[75] Inventor: Frank A. Radichel, Thornton, Colo.

[73] Assignee: Storage Technology Corporation, Louisville, Colo.

[22] Filed: May 28, 1975

[21] Appl. No.: 581,537

[52] U.S. Cl. ............................ 324/158 R; 324/51; 324/52; 324/133

[51] Int. Cl.² ............... G01R 31/02; G01R 31/08

[58] Field of Search .......... 324/120, 118, 126, 133, 324/51, 52, 158 R

[56] References Cited

UNITED STATES PATENTS

| | | | |
|---|---|---|---|
| 1,446,995 | 2/1923 | Sines | 324/126 |
| 2,114,298 | 4/1938 | Gunn | 324/118 |
| 2,133,670 | 10/1938 | Schuchmann | 324/118 |
| 3,619,775 | 11/1971 | Naylor et al. | 324/133 |

Primary Examiner—R. V. Rolinec
Assistant Examiner—Ernest F. Karlsen
Attorney, Agent, or Firm—Woodcock Washburn Kurtz & Mackiewicz

[57] ABSTRACT

A failing component connected to a node on a circuit board is located by applying voltage probes to the printed circuit lands connected to the node to determine the direction and magnitude of current flow. By determining the direction and magnitude of current flow to or from each of the components, a reliable determination can be made of the failing circuit component. The direction and magnitude of current flow is determined by use of a polarity indicator which includes a differential chopper amplifier, a high Q, high gain, active filter and digital gating circuitry.

9 Claims, 10 Drawing Figures

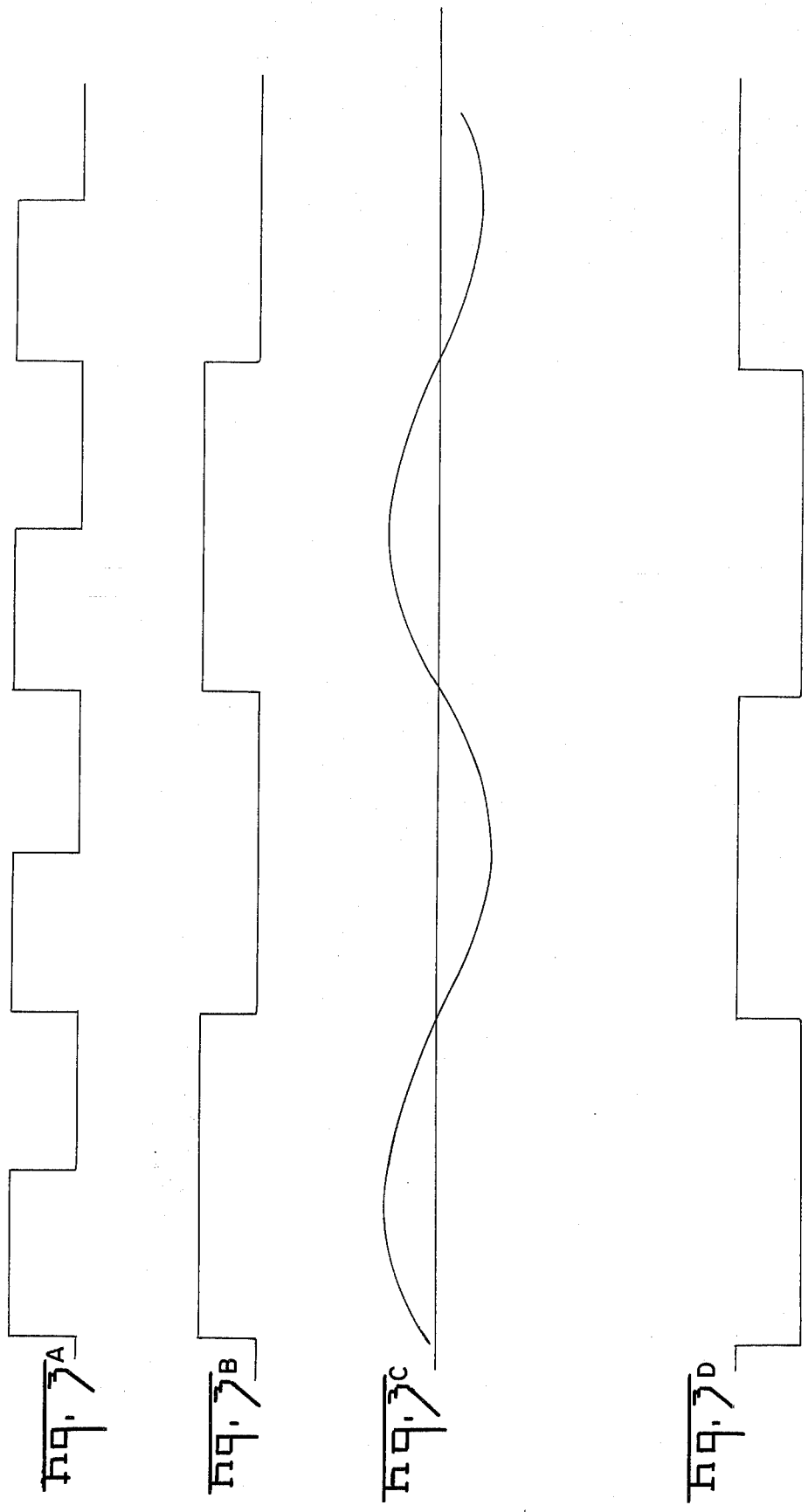

4,001,686

ELECTRONIC CIRCUIT TESTING APPARATUS

BACKGROUND OF THE INVENTION

This invention relates to testing electronic circuits and more particularly to the troubleshooting of electronic circuit boards to locate a failing component.

When an electronic circuit board does not perform properly, it is necessary for the technician first to locate the failing node in the circuitry and then to determine the failing component connected to that node. There are many techniques for locating the failing node. One common practice is to measure the voltage level at each node and compare it to standard levels to determine whether the voltage at that node is within limits. An oscilloscope may be used for this purpose in a similar manner.

After the failing node is located, the real problem is in determining which component connected to the node is defective or if there is a connection to some circuitry which is not supposed to be connected to the node. Commonly, the technician visually checks the circuitry for short circuits which may or may not be visible. If he finds none, the common practice is to replace the component driving the node. However, the assumption that it is this component which is failing is not always valid. Components having inputs connected to the node often fail in a manner which causes an erroneous voltage level to appear on the node.

In order to properly determine the failing component, the technician needs to know the cause of the logic levels being observed. More particularly, a determination must be made of the currents producing the voltage levels and the direction of those currents.

SUMMARY OF THE INVENTION

In accordance with this invention, the magnitude and polarity of current flowing to and from the components connected to a common node are determined in order to locate the source of the failure of that node.

Voltage probes are applied to points on one of the lands, or leads, connected to the failing node. A polarity indicator indicates the polarity of the voltage between the probes and hence the direction of current flow in that lead. The magnitude of the current is determined. The voltage probes are successively applied to the other leads connected to the node to determine the current flow in each of the leads. From this determination of the direction and magnitude of current flow to and from each of the components, the failing component is located.

The polarity indicator includes a differential chopper amplifier. This produces a square wave having an amplitude proportional to the difference between the voltages on the two probes. This square wave is applied to a high Q, high gain, active filter which converts the square wave to a sine wave. A zero crossing detector switches between two output levels when the sine wave goes through a reference level in the positive or negative going direction. The output of the zero crossing detector is applied to a flip-flop. This flip-flop is set to one state or the other in accordance with the output of the zero crossing detector at each sampling time. Sampling time is determined by a single shot multi-vibrator driven from the same oscillator used to perform the chopper switching.

DESCRIPTION OF THE DRAWINGS

FIGS. 3A–3D are waveforms depicting the operation.

DESCRIPTION OF THE PREFERRED EMBODIMENT

Figure 1A:
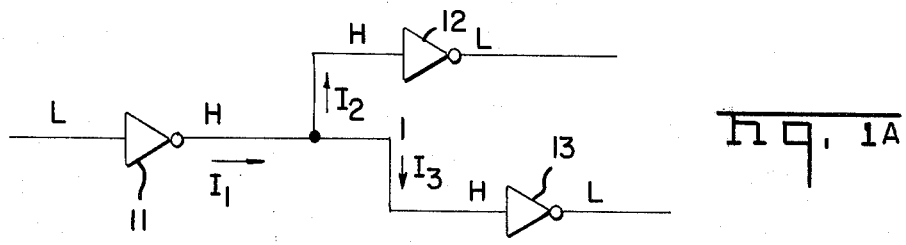
FIGS. 1A–1E show a circuit node which is operating properly and the same node under various failing conditions.

As an example of this invention, refer to FIG. 1A which shows the currents in a typical circuit node under proper operating conditions. FIGS. 1B–1E show the same node under various failure conditions. In FIG. 1A, the inverters 11, 12 and 13 are connected to a common node with the inverter 11 driving the node and the inverters 12 and 13 receiving inputs from the node. When a low logic level is applied to the input of inverter 11, the node is driven to a high logic level and the outputs of inverters 12 and 13 are driven to low logic levels. The arrows designated by $I_1$, $I_2$ and $I_3$ show the proper current flow in the three leads, or lands, connected to the node.

Figure 1B:
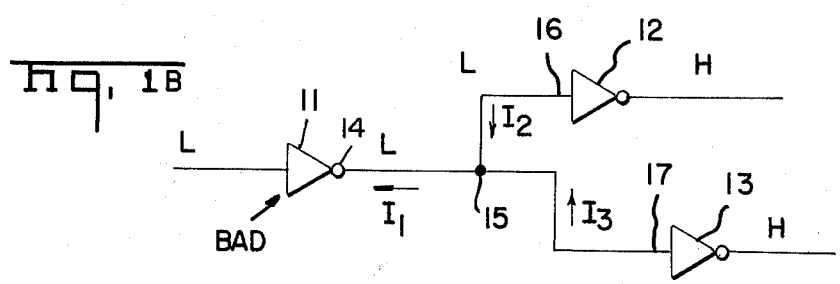

FIG. 1B depicts a situation in which the inverter 11 is defective. After having located this node as a failing node, the technician places voltage probes at the points 14 and 15. A determination is made of the direction and magnitude of the current flow between those points. Then the probes are placed between the points 15 and 16 and the same determinations of magnitude and direction of current flow are made. Finally, the same determinations are made between the points 15 and 17. These measurements show that the magnitude of the currents are normal but that the current $I_1$ is flowing toward output of the driving inverter 11. This indicates that the driving inverter 11 is defective, thereby holding the failing node low.

Figure 1C:
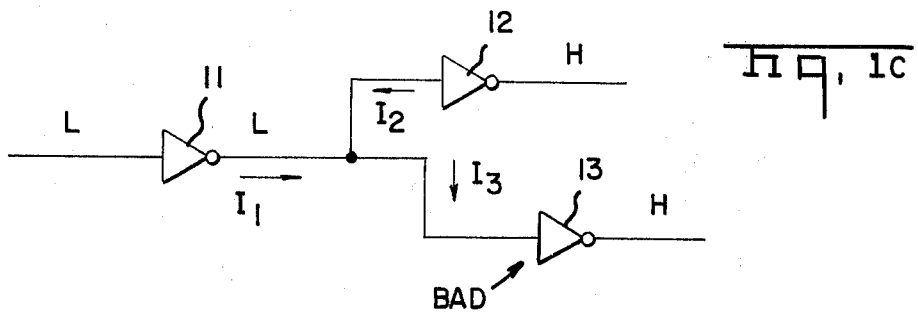

FIG. 1C depicts the situation in which the inverter 13 is defective. By making the same measurements of current magnitude and current direction, the technician ascertains that the logic currents are greater than normal and that the current is flowing toward the input of the defective inverter 13. This indicates to the technician that this component is bad and is holding the failing node low.

Figure 1D:
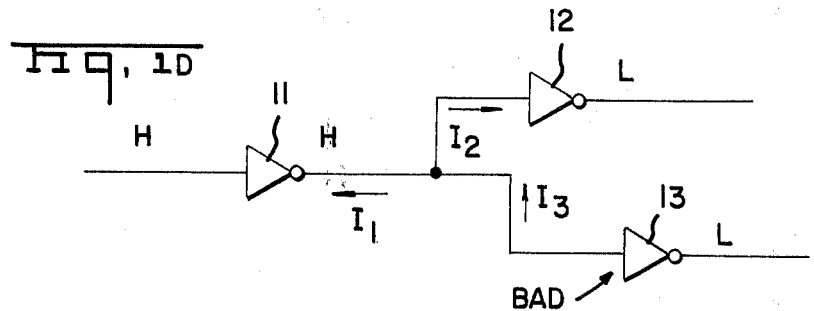

FIG. 1D is the reverse of FIG. 1C in that a high logic level is applied as an input to inverter 11. In this case, measurements again indicate higher than normal logic currents with current flowing from the input of inverter 13. Again this indicates that the inverter 13 is defective, thereby pulling the failing node to a high logic level.

Figure 1E:
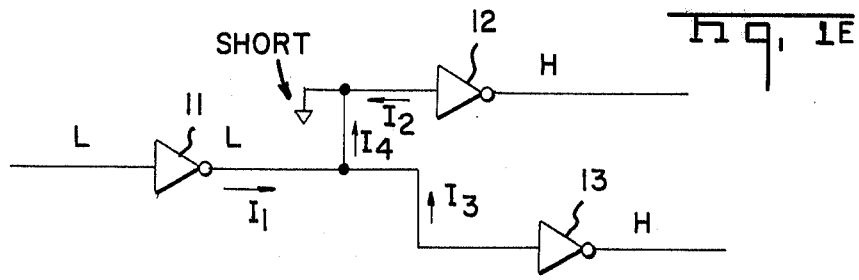

FIG. 1E depicts the situation in which there is a short circuit from the node to ground potential. When the technician measures magnitude and direction of current flow, he will detect a greater than normal current out of the input of inverters 12 and 13. He will also detect a greater than normal current flowing from the output of inverter 11. By moving the probes to different locations, the technician can determine the point toward which the current is flowing. Therefore, the short circuit, commonly caused by solder, may be located. In a similar manner, short circuits between printed circuit lands may be located using the method of this invention.

Figure 2:
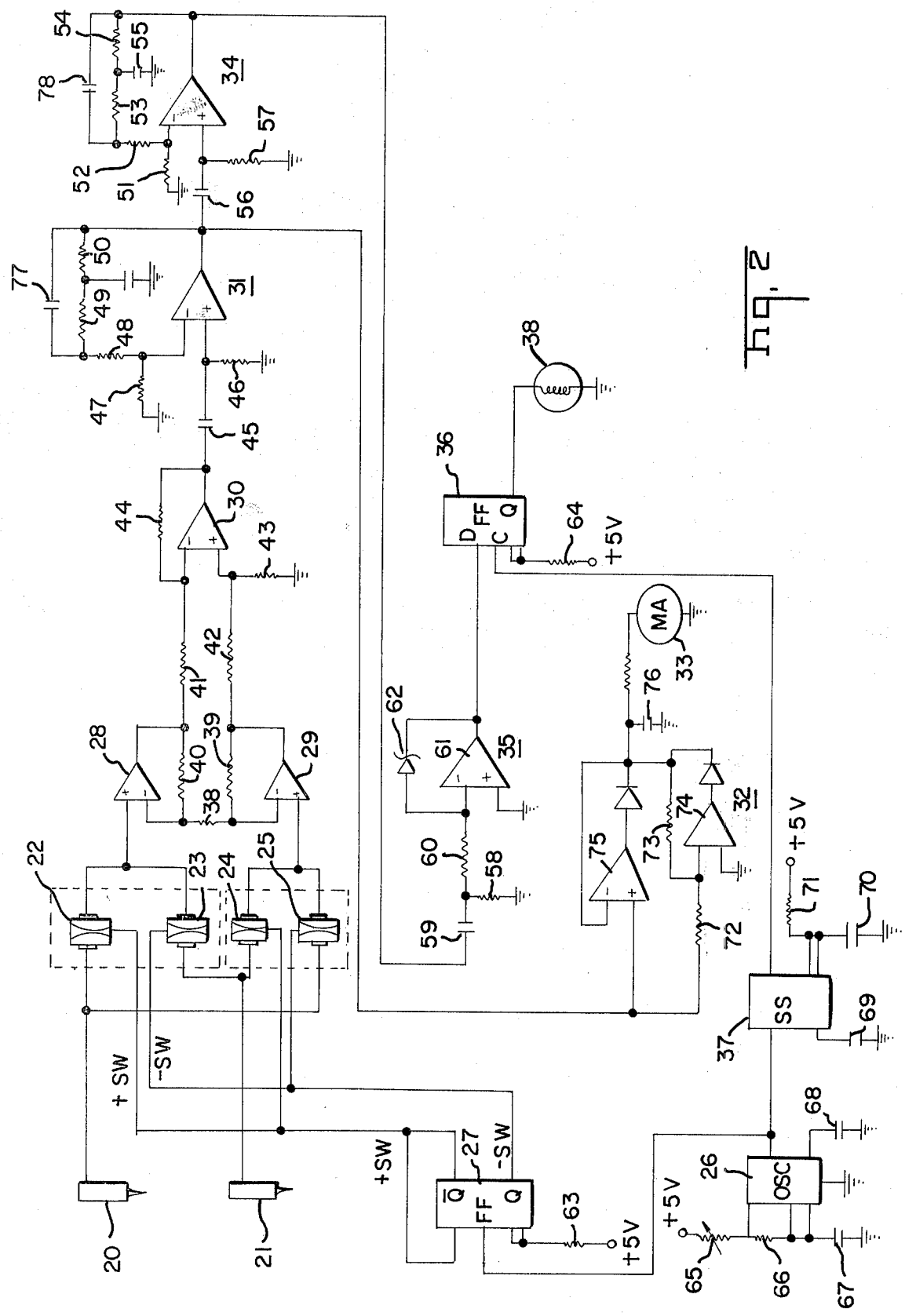
FIG. 2 shows the apparatus of this invention.

Referring to FIG. 2, the voltage probes 20 and 21 are connected to switching means including field effect transistors 22–25. These field effect transistors operate as switches and are rendered conductive and nonconductive by the signals +SW and −SW derived from oscillator 26. The output of oscillator 26 is applied to the flip-flop 27 which generates the oppositely phased signals +SW and −SW. Field effect transistors 22 and 23 are alternately and oppositely rendered conductive and nonconductive by the signals +SW and −SW. The field effect transistors 22 and 23 are connected together and are connected to one input of operational amplifier 28. The output of operational amplifier 28 is a square wave having an amplitude proportional to the difference in voltage sensed by the two probes 20 and 21. The square wave has a frequency related to that of the oscillator.

The voltages on probes 20 and 21 are also applied to field effect transistors 24 and 25. These transistors are also alternately and oppositely rendered conductive and nonconductive by the signals +SW and −SW. The transistors 24 and 25 are connected together and to one input of operational amplifier 29. The outputs of operational amplifiers 28 and 29 are applied as inputs to the differential amplifier 30. This produces a single ended square wave having an amplitude proportional to the voltage difference sensed by the two probes and having a frequency related to that of oscillator 26.

The output of differential amplifier 30 is applied to an AC coupled active filter 31. This removes noise and converts the square wave to a sine wave. This sine wave is applied to the peak detector 32 which produces a DC voltage representing the magnitude of the current flow between the probes 20 and 21. This DC voltage is applied to the meter 33 which indicates current magnitude to the technician.

The sine wave is applied to another active filter 34 which provides further noise suppression and amplification. The output of this filter is applied to a zero crossing detector 35. This circuit switches between two output levels. When the sine wave goes through ground potential in the positive going direction, detector 35 switches to a low output level and when the sine wave goes through ground potential in the negative going direction, the detector switches to a high output level. The output of the zero crossing detector 35 is applied to the D input of flip-flop 36. Flip-flop 36 is set to one state if the output of the zero crossing detector 35 is high, and is set to the other state if the output of zero crossing detector 35 is low.

Single shot multi-vibrator 37 is used to set the flip-flop 36 at sampling intervals. These intervals are determined by the oscillator 26. At the beginning of each cycle of the oscillator 26, the single shot multi-vibrator 37 is triggered. It produces a sample signal approximately in the middle of the oscillator cycle. This is applied to the C input of flip-flop 36 to set the flip-flop at the sample time. The output of flip-flop 36 is applied to the indicator 38 which indicates polarity. (Commonly the indicator 38 is a light emitting diode.) When the polarity from one probe to another is positive, for example, the indicator 38 will be lit but if the polarity is reversed, the lamp will not be lit.

FIGS. 3A-3D are waveforms depicting the operation. The waveform A is the waveform at the output of oscillator 26. This is divided down by the flip-flop 27 to produce the waveform shown in FIG. 3B.

FIG. 3C shows the sine wave produced by the chopper action and as appearing at the output of the filter 34. Note that had the polarity of the voltage between the probes been reversed, the phase of the sine wave would be 180° from that shown in FIG. 3C.

The output of the zero crossing detector is depicted in FIG. 3D. The output of the zero crossing detector 35 is sampled by the signal from the output of single shot multi-vibrator 37. The single shot multi-vibrator 37 is triggered when the signal shown in FIG. 3B goes negative. The single shot times out to produce a sampling voltage approximately in the middle of each oscillator cycle. In this manner, the flip-flop 36 is set to a state indicating the polarity of the voltage and current between the two probes.

The following component values are given by way of example only. Integrated circuits are designated by standard type numbers.

| | |
|---|---|
| Field Effect Transistors 22–25 | AHO 134 |
| Oscillator 26 | 556 |
| Flip-Flop 27 | 7474 |
| Operational Amplifiers 28–31 | 5558 |
| Flip-Flop 36 | 7474 |
| Single Shot 37 | 556 |
| Resistor 38 | 100 ohms |
| Resistors 39–40 | 2K |
| Resistors 41–44 | 499 ohms |
| Capacitor 45 | 2.2μ |
| Resistor 46 | 100K |
| Resistors 47–54 | 158K |
| Capacitors 55–56 | 2.2μ |
| Resistors 57–58 | 100K |
| Capacitor 59 | 1μ |
| Resistor 60 | 110K |
| Amplifier 61 | 5558 |
| Diode 62 | 1N751 |
| Resistors 63–64 | 1K |
| Resistor 65 | 20K |
| Resistor 66 | 14.3K |
| Capacitor 67 | 1μ |
| Capacitors 68–69 | .015 |
| Capacitor 70 | .22μ |
| Resistor 71 | 158K |
| Capacitors 71–73 | 158K |
| Amplifiers 74–75 | 5558 |
| Capacitor 76 | 2.2μ |

While a particular embodiment of the invention has been shown and described, various modifications are within the true spirit and scope of the invention. The appended claims are intended to cover all such modifications.

What is claimed is:

1. The method of locating a failing circuit connected by leads to a common node comprising:
   applying first and second voltage probes to adjacent points on one of the leads connected to said node,
   indicating the polarity of the voltage between said probes to determine the direction of current flow between said two points by setting a flip-flop in accordance with said direction of current flow,
   simultaneously measuring the current flow between said two points,
   successively applying said voltage probes to points on other leads connected to said node, and
   repeating said indicating and measuring steps to determine the direction and magnitude of current flow in each of said leads.

2. The method recited in claim 1 wherein the step of indicating the polarity comprises:
   chopping the voltages on said first and second probes to generate a square wave having an amplitude representing the difference between the voltages on said probes and a frequency related to the chopping rate, sampling a signal representative of said square wave at sampling times related to said chopping rate, and setting said flip-flop in accordance with the level of said square wave at the time of sampling.

3. Apparatus for locating a failing circuit connected by leads to a common node comprising:

first and second voltage probes connectable to adjacent points on one of the leads connected to said node, switching means, the voltage on said first and second probes being applied to said switching means, an oscillator, the output of said oscillator being applied to said switching means to generate a square wave having an amplitude representing the difference between the voltages on said probes and a frequency related to the frequency of said oscillator, means for sampling a signal representative of said square wave in timed relationship with the output of said oscillator, and a flip-flop, said flip-flop being set to one state or the other by the sampled voltage, the state of said flip-flop representing the polarity of the voltage between said probes.

4. The apparatus recited in claim 3 wherein said switching means comprises:

first and second switches alternately and oppositely rendered conductive and non-conductive by said oscillator, the voltage on said first and second probes being respectively applied to said first and second switches, third and fourth switches alternately and oppositely rendered conductive and non-conductive by said oscillator, the voltage on said second and first probes being respectively applied to said third and fourth switches, and a differential amplifier, said first and second switches being connected together to one input of said differential amplifier, said third and fourth switches being connected together to the other input of said amplifier, said differential amplifier producing said square wave having an amplitude representing the difference in the voltages between the probes.

5. The apparatus recited in claim 4 further comprising:

a filter, the square wave output of said differential amplifier being applied to said filter to produce a sine wave output.

6. The apparatus recited in claim 5 further comprising:

a zero crossing detector, said sine wave being applied to said zero crossing detector, the output of said zero crossing detector being switched between a first and second level when said sine wave goes positive with respect to a reference voltage and when said sine wave goes negative with respect to a reference voltage, the output of said zero crossing detector being applied to the set input of said flip-flop.

7. The apparatus recited in claim 6 further comprising:

a single shot multi-vibrator, the output of said oscillator being applied to trigger said single shot multi-vibrator at predetermined times, said single shot multi-vibrator producing a sample signal at a fixed time thereafter, said sample signal being applied to the toggle input of said flip-flop to set it in accordance with the state of the output of the zero crossing detector.

8. The apparatus recited in claim 7 further comprising an indicator connected to the output of said flip-flop to indicate the polarity of the voltage between said probes.

9. The apparatus recited in claim 5 further comprising:

a peak detector, said sine wave being applied to said peak detector, a meter, the output of said peak detector being applied to said meter to indicate the magnitude of current flow between said probes.

* * * * *